United States Patent [19]

Oyaba et al.

[11] Patent Number: 4,991,687

[45] Date of Patent: Feb. 12, 1991

[54] SPEAKER SYSTEM HAVING DIRECTIVITY

[75] Inventors: Takashi Oyaba; Hideaki Morikawa; Yasuo Gan, all of Saitama; Naobumi Kanemaki, Tokyo, all of Japan

[73] Assignees: Pioneer Electronic Corporation; Nippon Telegraph and Telephone Corporation, both of Tokyo, Japan

[21] Appl. No.: 454,239

[22] Filed: Dec. 21, 1989

[30] Foreign Application Priority Data

Mar. 14, 1989 [JP] Japan ................................ 1-59681

[51] Int. Cl.[5] ........................................ H05K 5/00

[52] U.S. Cl. ................................ 181/145; 181/144; 181/147; 381/74; 381/90

[58] Field of Search ...................... 181/144, 145, 147; 381/24, 89, 90

[56] References Cited

U.S. PATENT DOCUMENTS 3,637,039 1/1972 Raichel et al. .................... 181/146

4,497,064 1/1985 Polk ..................................... 381/24

*Primary Examiner*—Benjamin R. Fuller

*Attorney, Agent, or Firm*—Sughrue, Mion, Zinn, Macpeak & Seas

[57] ABSTRACT

A speaker system comprises a pair of speakers for a higher frequency range and a pair of speakers for a lower frequency range. The speakers for the lower range are disposed with a space $d_1$ equal to the wavelength $\lambda_c$ of a division frequency $f_c$ of a reproduction frequency range, and speakers for the higher range are disposed with a space $d_2=d_1/4$ to $d_1/2$ in the middle of the lower frequency speakers. Another speaker system comprises a speaker for reproducing signals in a lower frequency range of a reproduction frequency range to be reproduced, and a speaker for reproducing a higher frequency range of the frequency range, wherein a sound path dividing construction is provided for dividing the sound path of each of the speakers into two paths to provide openings for the lower frequency range and the higher frequency range. The openings for the lower frequency range are disposed with a space $d_1$ therebetween while the openings for the higher frequency range are disposed with a space $d_2$ therebetween, where $d_1=\lambda_c\pm50\%$ and $d_2=d_1/4$ to $d_1/2$.

2 Claims, 3 Drawing Sheets

SPEAKER SYSTEM HAVING DIRECTIVITY

BACKGROUND OF THE INVENTION

This invention relates to a loudspeaker system effecting sound directivity, in which a plurality of speakers are disposed in a suitably spaced relation for causing a strong sound pressure in a specific direction by mutual interference of acoustic waves.

Conventionally, a loudspeaker system of a Tonsaule type in which a plurality of speakers, e.g., four speakers, are arranged in a straight line as shown in FIG. 6, have been well known as a speaker system for effecting sound directivity.

With the Tonsaule type speaker system as shown in FIG. 6, the speakers SP are aligned in a line with a predetermined distance d between each and other speakers. Thus, as shown in FIG. 3, the sound pressures from two speakers SP cancel each other out to produce a zero pressure at a point $P_{90}$ in a direction of 90° relative to a point $P_0$ on the center axis, such cancellation being due to the fact that the phase difference between the two sound pressures is 180° out of phase at the point $P_{90}$ at a frequency $f_0$ and having wavelength of which is given by $d=\lambda/2$.

At the point $P_0$, the sound pressures strengthen each other to cause a peak value of the sound pressure in the $P_0$ direction. At a point $P_\theta$ between the point $P_0$ and the point $P_{90}$ the sound pressure is of a value between the peak value and the zero pressure, with the sound pressure decreasing gradually toward zero pressure with increasing angles of direction toward $P_{90}$, thus resulting in a directive pattern indicated by a solid line curve as shown in FIG. 4.

However, with sound at a frequency having a wavelength $d=\lambda$, the sound pressures strengthen each other at the point $P_{90}$, causing a directive pattern as shown by a dotted line in FIG. 4.

For the reasons described above, the Tonsaule type speaker system exhibits, as shown in FIG. 7, a directivity pattern depicted by a solid line A at the mid frequency range and by a dotted line B at lower frequency range, thus causing or effecting an inadequate sound directivity.

Further, the Tonsaule arrangement is further disadvantaged in that it is required that the speakers be disposed or distanced in a spaced relation of $d=\lambda/2$, which leads to a large overall size of the system.

In addition to the Tonsaule type speaker, a parametric speaker has also been in practical use but it has not been widely used because it suffers from problems in that an ultrasonic modulation device is required, and reproduction of the sound at the lower frequency range is inherently difficult.

SUMMARY OF THE INVENTION

An object of the present invention is to provide a loudspeaker system in which the drawbacks of the conventional speaker systems consisting of a plurality of speakers are eliminated, a strong sound directivity is obtained in the direction of the central axis, and the system may be constructed to be compact in size.

A speaker system according to the present invention is of a type in which the frequency range to be reproduced is divided at an arbitrary frequency or division frequency into a higher frequency range and a lower frequency range, each of which being reproduced through a corresponding pair of speakers. The low speakers for the lower range are disposed with a space $d_1$ equal to the wavelength of the division frequency therebetween, and the high speakers for the higher range are disposed in the middle of the lower frequency speakers with a space $d_2=d_1/4$ to $d_1/2$ therebetween.

Another speaker system according to the invention comprises a speaker for reproducing signals in the lower frequency range and a speaker for reproducing signals in the higher frequency range, and a sound path dividing means for dividing the sound path of each of the speakers into two paths to provide openings for the lower frequency range and the higher frequency range. The openings for the lower frequency range are disposed with a space $d_1$ therebetween, while the openings for the higher frequency range are disposed with a space $d_2$ therebetween, where $d_1=\lambda_c\pm50\%$ and $d_2=d_1/4$ to $d_1/2$ ($\lambda_c$ being a wavelength corresponding to a division frequency).

BRIEF DESCRIPTION OF THE DRAWINGS

Other features and objects of the present invention will be more apparent from the following description of preferred embodiments and the accompanying drawings in which.

DETAILED DESCRIPTION OF THE PREFERRED EMBODIMENTS

Preferred embodiments of the invention will now be described with reference to the drawings.

Figure 1:
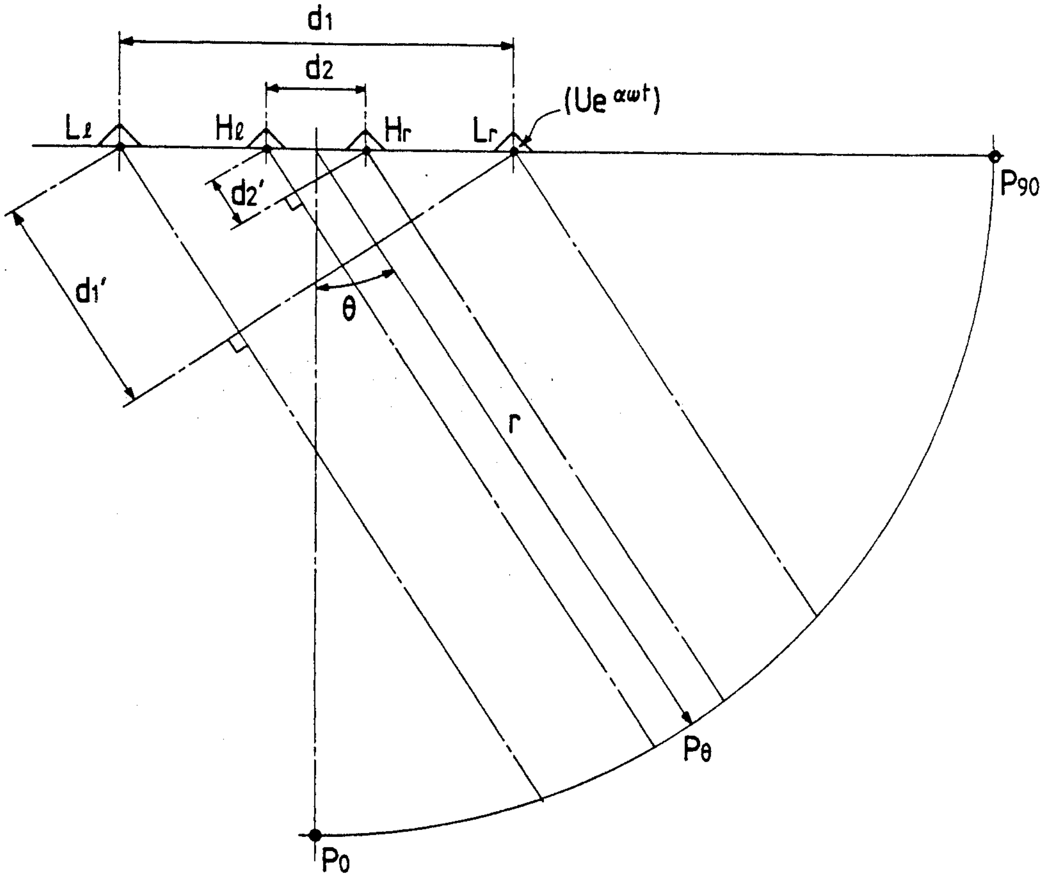
FIG. 1 is an illustrative drawing of an embodiment of the present invention.

In FIG. 1, a pair of low frequency range speakers (low-range speakers), Ll and Lr, are disposed side by side, and supplied signals through a low pass filter (not shown). The low pass filter attenuates the signal level in such a way that the sound pressure is decreased by 6 dB at a division frequency $f_c$ (at which the entire reproduction frequency range is divided into a high frequency range and a low frequency range), and decreased by 18 dB at a frequency $2f_c$. The low range speakers are disposed with a space $d_1$, which is equal to a wavelength $\lambda_c$ corresponding to the division frequency $f_c$.

A pair of high frequency range speakers (high-range speakers), Hl and Hr, are disposed with a space $d_2=d_1/4$ between or in the middle of the aforementioned low-range speakers Ll and Lr. Signals are supplied to the high-range speakers Hl and Hr through a high pass filter (not shown) which attenuates the signal level in such a way that the sound pressure is decreased by 6 dB at the frequency $f_c$ and by 18 dB frequency $f_c/2$. Each of the high and low frequency range speakers has the same volume velocity, and each can be thought of as a separate point or source of sound.

In the direction of 90° relative to the central axis, the resultant sound pressure $P_t$ (at the point $P_{90}$ sufficiently remote from the point source by a distance r) is given by the following equation:

$$P_t \approx \frac{U}{4\pi r}\{G_1 e^{j(\omega t-\alpha)} e^{(\omega t-k(r+d1/2))} + G_1 e^{(\omega t+\alpha)} e^{j(\omega t-k(r-d1/2))} + G_2 e^{j(\omega t+\beta)} e^{j(\omega t-k(r+d2/2))} + G_2 e^{j(\omega t+\beta)} e^{j(\omega t-k(r-d2/2))}\} \quad (1)$$

where k is the wavelength ($=\omega/c=2\pi f/c$);

c is the velocity of sound;

$G_1$ is the gain of the low frequency range filter;

$\alpha$ is the phase of the low frequency range filter;

$G_2$ is the gain of the high frequency range filter; and $\beta$ is the phase of the high frequency range filter.

Thus since $G_1 \simeq 1$, $\alpha \simeq 0$, and $G_2 \simeq -18$ dB ($=0.125$) at a frequency of $f_1 = f_c/2$, the sound pressure is given by:

$$P_{tf1} \approx \frac{Ue^{j\omega t}}{4\pi r}\{e^{-jk(r+d1/2)} + e^{-jk(r-d1/2)} + 0.125\,(e^{-j(k(r+d2/2-\beta))} + e^{-j(k(r-d2/2-\beta))}\} = \frac{Ue^{j\omega t}}{4r}\{e^{-jkr}2\cos(kd_1/2) + 0.125e^{-j(kr-\beta)}2\cos(kd_2/2)\},$$

$$\text{since } d_1 = \frac{\lambda_1}{2} = \frac{\pi}{k},\ d_2 = \frac{d_1}{4} = \frac{\pi}{4k}$$

$$\cos(kd_1/2) = 0,\ \cos(d_2/2) \approx 0.93,$$

therefore:

$$P_{tf1} \approx \frac{Ue^{j\omega t}}{4\pi r}\cdot 0.125e^{-j(kr-\beta)}\cdot 2\cdot 0.93 = \frac{U}{4\pi r}\,0.232e^{j(\omega t-kr+\beta)} \quad (2)$$

Since $G_1 \simeq 0.125$, $G_2 \simeq 1$, and $\beta \simeq 0$, at a frequency $f_2 = 2f_c = 4f_1$, the sound pressure will be exactly the same as for equation (2) except that the sound pressure differ in phase at higher frequencies. That is, the sound pressure is given by:

$$P_{tf2} = \frac{U}{4\pi r}\,0.232e^{j(\omega t-kr-\alpha)} \quad (3)$$

Since $G_1=0.5$, $\alpha \simeq -\pi/2$, $G_2=0.5$, and $\beta=\pi/2$ at a frequency $f_c$ between $f_1$ and $f_2$, if the signal is applied in a reversed polarity to the high frequency filter, then one can obtain $\beta=-\pi/2$.

Thus the sound pressure is given as follows:

$$P_{tfc} \approx \frac{Ue^{j\omega t}}{4\pi r}\{0.5e^{j(k(r+d1/2)+\pi/2)} + 0.5e^{-j(k(r+d2/2)+\pi/2)} + 0.5e^{-j(k(r-d1/2)+\pi/2)} + 0.5e^{-j(k(r-d2/2)+\pi/2)}\} = \frac{Ue^{j\omega t}}{4\pi r}e^{-j(kr+\pi/2)}\{\cos(kd_1/2) + \cos(kd_2/2)\}$$

Here $f_c = 2f_1 = f_2/2$, therefore $d_1 = \lambda_c$, $d_2 = d_1/4$, where $\lambda_c$ is the wavelength of $f_c$.

Thus one can obtain:

$$\cos(kd_1/2) = \cos(\pi) = -1$$

$$\cos(kd_2/2) = \cos(\pi/4) = 0.707,$$

and further, one can obtain:

$$P_{tfc} \approx \frac{U}{4\pi r}(-0.293)e^{j(\omega t-kr-\pi/2)} \quad (4)$$

Moreover, the sound pressure $P_{t0}$ at the point $P_0$ on the central axis is given by:

$$P_{t0} \approx \frac{U}{4\pi r}4e^{j(\omega t-kr)} \quad (5)$$

The ratios R's of the sound pressure in the direction of 90° relative to the central axis, to that at a point on the central axis, will be as follows at the frequencies f1, f2, and fc, respectively $$R_{f1} = \left|\frac{P_{tf1}}{P_{t0}}\right| = \frac{0.232}{4} = -24.7 \text{ dB}$$

$$R_{f2} = \left|\frac{P_{tf2}}{P_{t0}}\right| = \frac{0.232}{4} = -24.7 \text{ dB}$$

$$R_{fc} = \left|\frac{P_{tfc}}{P_{t0}}\right| = \frac{0.293}{4} = -22.7 \text{ dB}.$$

thus resulting in an atte uat on of he sound pressure of more than 20 dB with respect to the sound pressure $P_{t0}$ on the central axis.

The above result is the case where it is assumed that the speakers have no inherent directivity at all. As a practical matter, a still larger attenuation can be expected because actual speakers inherently have some directivity.

Figure 2:
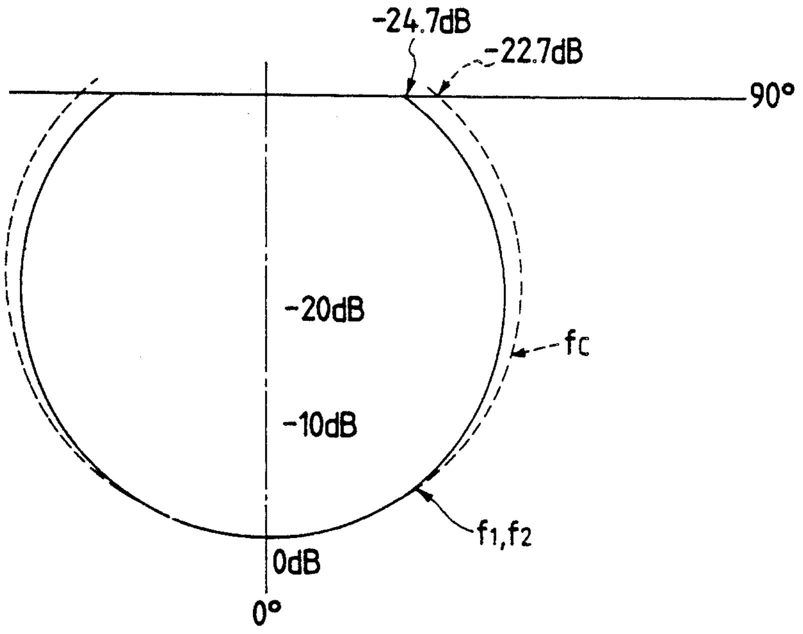
FIG. 2 is a diagram for illustrating the directivity pattern of the present invention.
Figure 3:
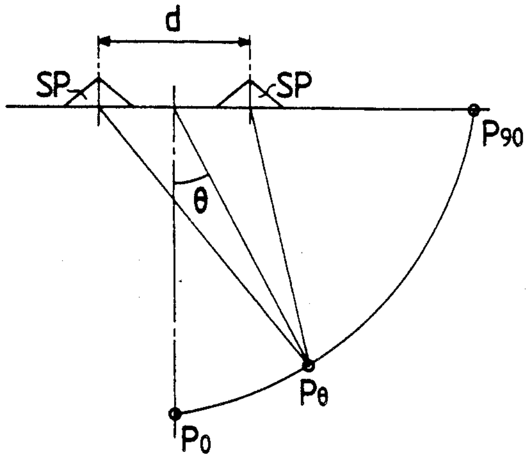
FIG. 3 is a diagram for showing a sound pressure produced by two speakers.
Figure 4:
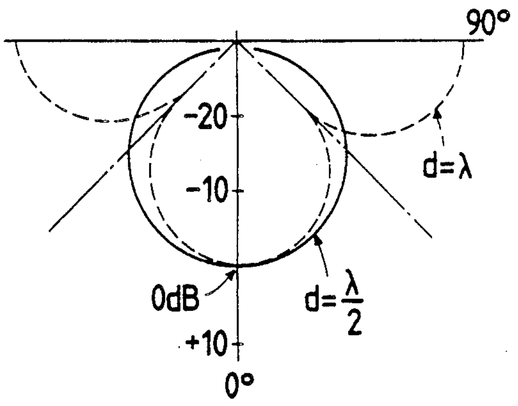
FIG. 4 shows the directivity pattern obtained from the configuration of FIG. 3.

Further, at angles from 0° to 90°, the phase difference between the sound pressures due to the different distances from the individual speakers will be within $\pi/2$ within the respective frequency range. Accordingly, there will not be effected peak values in the sound pressure distribution, but there will be an attentuation effect due to cancellation of the sound pressure. Thus, an ideal directivity characteristic in which the sound pressure decreases smoothly can be obtained as shown in FIG. 2.

The embodiment thus far described is a basic configuration of the invention in which a set of four speakers are used to obtain a narrow directivity over a frequency range of two octaves ranging from $f_1$ to $f_2$. An extended frequency range of two additional octaves can be obtained on the high frequency side and/or the low frequency side by disposing two additional speakers for the high frequency range and/or the low frequency range in the same manner as described previously, i.e., with a space of $\frac{1}{4}$ of $d_2$ for the higher frequency range and a space four times $d_1$ for the lower frequency range, respectively.

Figure 5:
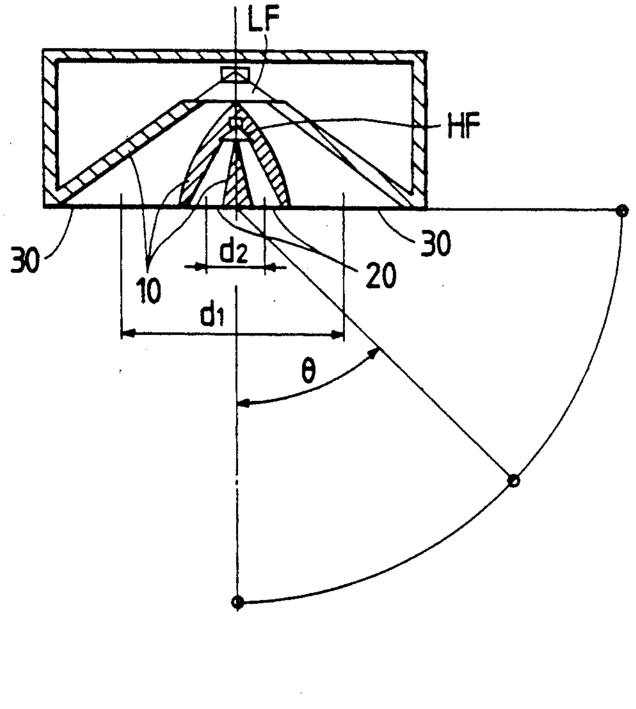
FIG. 5 is a diagram for showing another embodiment of the invention.
Figure 6:
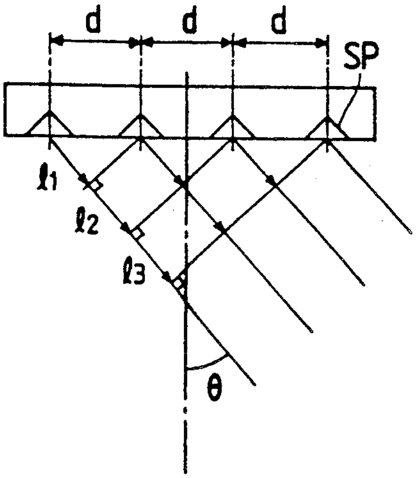
FIG. 6 PRIOR ART
FIG. 6 is a diagram for illustrating the principle of a conventional Tonsaule type speaker system.
Figure 7:
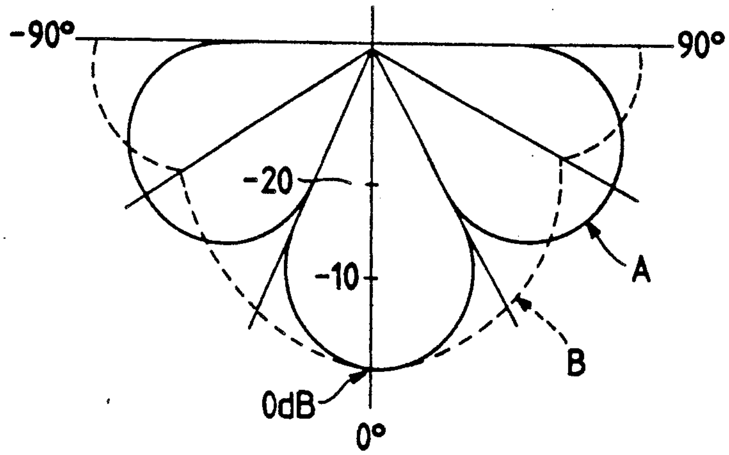
FIG. 7 PRIOR ART
FIG. 7 is a diagram for illustrating the directivity pattern obtained from the configuration of FIG. 6.

Advantageously, the individual speakers to be used should be of a strong directivity; thus a horn type speaker or the addition of a horn baffle to a cone type speaker will provide a further improved directivity. For example, as shown in FIG. 5, two driving speakers are used, one HF for the high frequency range and the other LF for the lower frequency range, and with the sound path of each speaker being divided by a horn 10 into two paths to provide horn openings at two locations, i.e., openings 20 for the higher frequency range and openings 30 for the lower frequency range, thereby providing the same effect as the previously mentioned four speakers arrangement. Additionally, the space $d_2$ between the high frequency openings 20 and the space $d_1$ between the low frequency openings 30 are arranged in a manner similar to the embodiment shown in FIG. 1.

While the basic embodiment has been described with the highest attentuation obtained in the direction of 90° with respect to the central axis, a directivity characteristic having a further narrower angle can be implemented. Such can be effected by setting the spaces $d_1$ and $d_2$ in such a way that distances $d_1'$ and $d_2'$ for an angle $\theta$ less than 90° relative to the central axis are $\lambda/2$, respectively, as shown in FIG. 1. The distances $d_1'$ and $d_2'$ are given by the following equations, respectively:

$$d_1' = d_1 \sin\theta$$

$$d_2' = d_2 \sin\theta$$

For example, if the angle $\theta = 45°$, then the sound pressure theoretically is supposed to become a maximum again in the direction of 90°. However, in practice the inherent directivity of the speakers comes into play to actually provide a considerable net attentuation in the 90° direction dependent on the diameters and the frequency, and thus the resultant sound directivity will still be narrow.

It is not necessary that the spaces $d_1$ and $d_2$ be strictly maintained to $\lambda_c$ and $d_1/4$, respectively, because the inherent directivity of the speakers and a diffraction effect due to the practical effect that geometry of the baffle or the cabinet (to which the speakers are mounted) influence the overall directivity characteristic. Thus conditions that deviate somewhat from the above conditions may well exhibit a better directivity characteristic. However, experiments have revealed that the directivity characteristic will be degraded beyond the following conditions:

$$d_1 = \lambda_c \pm 50\%,\ d_2 = \frac{d_1}{2} \text{ to } \frac{d_1}{4}$$

The present invention can provide a narrow directivity over the frequency range of two octaves by using four speakers and even wider frequency range by using additional speakers, and can provide a smooth attenuation of the sound pressure with an increase in angle from the central axis without side lobes developing in its directivity pattern.

The speaker system according to the present invention can be made small in size as compared to a conventional Tonsaule type speaker system, and a wider reproduction frequency range for the same directivity may be obtained with an increment of two octaves for each successive addition of a pair of speakers.

What is claimed is:

1. A speaker system for effecting sound directivity, said speaker system comprising two pairs of speakers for reproducing signals in a frequency range, said frequency range being divided at a frequency $f_c$ having a wavelength of $\lambda_c$ into a higher frequency range and a lower frequency range, a first pair of said two pairs of speakers reproducing signals in said higher frequency range and a second pair of said two pairs of speakers reproducing signals in said lower frequency range, wherein said second pair of speakers for the lower frequency range is disposed with a first space $d_1$ therebetween and said first pair of speakers for the higher frequency range is disposed with a second space $d_2$ therebetween in such a way that $$d_1 = \lambda_c \pm 50\% \text{ and } d_2 = d_1/4 \text{ to } d_1/2.$$

2. A speaker system for effecting sound directivity, comprising:

a low-range speaker for reproducing signals in a lower frequency range of a reproduction frequency range divided by a division frequency $f_c$ having a wavelength $\lambda_c$, a high-range speaker for reproducing signals in a higher frequency range of the reproduction frequency range divided by the division frequency $f_c$, and sound path division means for dividing a sound path of each of said low-range and high-range speakers into two paths to provide openings for said lower frequency range and openings for said higher frequency range, wherein said openings for said lower frequency range are disposed with a space $d_1$ therebetween and said openings for said higher frequency range are disposed with a space $d_2$ therebetween, in such a way that $d_1 = \lambda_c \pm 50\%$ and $d_2 = d_1/4$ to $d_1/2$.

* * * * *